United States Patent
Healy et al.

(10) Patent No.: US 9,734,885 B1
(45) Date of Patent: Aug. 15, 2017

(54) THERMAL-AWARE MEMORY

(71) Applicant: INTERNATIONAL BUSINESS MACHINES CORPORATION, Armonk, NY (US)

(72) Inventors: Michael B. Healy, Cortlandt Manor, NY (US); Hillery C. Hunter, Chappaqua, NY (US); Saravanan Sethuraman, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/291,127

(22) Filed: Oct. 12, 2016

(51) Int. Cl.
  G11C 11/00  (2006.01)
  G11C 11/16  (2006.01)
  G06F 1/20   (2006.01)
  G11C 7/10   (2006.01)

(52) U.S. Cl.
  CPC .......... *G11C 11/1675* (2013.01); *G06F 1/206* (2013.01); *G11C 7/1072* (2013.01); *G11C 11/1673* (2013.01)

(58) Field of Classification Search
  None
  See application file for complete search history.

(56) References Cited

U.S. PATENT DOCUMENTS

| | | | |
|---|---|---|---|
| 8,385,107 B2 | 2/2013 | Prejbeanu | |
| 8,530,987 B2 | 9/2013 | Aikawa et al. | |
| 8,929,167 B2 | 1/2015 | Kim et al. | |
| 9,218,864 B1 | 12/2015 | Yi et al. | |
| 2002/0065981 A1* | 5/2002 | Jenne | G06F 13/161 711/105 |
| 2009/0190427 A1* | 7/2009 | Brittain | G06F 13/1684 365/212 |
| 2010/0019297 A1 | 1/2010 | Hwang | |
| 2013/0080679 A1 | 3/2013 | Bert | |
| 2013/0110308 A1* | 5/2013 | Pereira | G05D 23/19 700/300 |
| 2014/0211551 A1 | 7/2014 | Kim et al. | |
| 2015/0206568 A1* | 7/2015 | Bose | G11C 11/1675 365/158 |
| 2015/0206569 A1* | 7/2015 | Bose | G11C 11/16 365/158 |

(Continued)

OTHER PUBLICATIONS

Benso, "An on-line BIST RAM architecture with self-repair capabilities", IEEE Transactions on Reliability, Apr. 2002, pp. 123-128, vol. 51, No. 1.

(Continued)

*Primary Examiner* — Son Dinh
*Assistant Examiner* — Uyen B Tran
(74) *Attorney, Agent, or Firm* — Cantor Colburn LLP; Feb R. Cabrasawan

(57) ABSTRACT

A method for operating a memory system includes receiving thermal data indicating a temperature at addresses in a memory array, and a write request associate with data. An address of the write request is decoded. It is determined whether a temperature at the address of the write request is above a threshold temperature. The data is sent to a short latency write queue responsive to determining that the temperature is not above the threshold temperature.

20 Claims, 7 Drawing Sheets

(56) References Cited

U.S. PATENT DOCUMENTS

2016/0118576 A1    4/2016  Higo et al.
2016/0266934 A1*   9/2016  Rimoni ................ G06F 9/5038

OTHER PUBLICATIONS

Del Bel et al., "Improving STT-MRAM density through multibit error correction", Department of ECE, University of Minnesota, pp. 1-6.
Kang, W. et al "Yield and Reliability Improvement Techniques for Emerging Nonvolatile STT-MRAM", IEEE 2015 Journal of Emerging and Selected Topics in Circuits and Systems (JETCAS), Mar. 2015, vol. 5, issue 1.
Pajouhi et al., "Yield, Area and Energy Optimization in STT-MRAMs using failure aware ECC", Cornell University Library, Sep. 28, 2015, pp. 39:1-39:19.
Sun, et. al, Exploring the Vulnerability of CMPs to Soft Errors with 3D Stacked Non-Volatile Memory, IEEE, 2011, pp. 366-372.
Sun, G. et al., "An Energy-Efficient 3D Stacked STT-RAM Cache Architecture for CMPs", Chapter Emerging Memory Technologies, Oct. 22, 2013, pp. 145-167.
Supervisor: Ingrid De Wolf "STT-MRAM testing (ref. P1406-12)," http://www.imec-in.in/in_en/careers/phd/materials-competence-center/stt-mram-testing.html; Retreived Sep. 27, 2016, pp. 1.
Swaminathan, K. et al, "Towards Resilient Micro-architectures: Datapath Reliability Enhancement Using STT-MRAM," 2011 IEEE Computer Society Annual Symposium on VLSI, Chennai, Jul. 2011, pp. 236-241.
W.S. Zhao et al., "Failure and reliability analysis of STT-MRAM", Microelectronics Reliability, Elsevier, 2012, pp. 1848-1852, vol. 52.

* cited by examiner

THERMAL-AWARE MEMORY

BACKGROUND

The present invention generally relates to memory devices, and more specifically, to thermally aware memory devices.

Memory devices such as random access memory (RAM) continue to develop by using improved memory technology. Spin-Transfer Torque Magnetic Random Access Memory (STT-MRAM) devices offer improved memory performance over previous RAM devices.

STT-MRAM offers high performance with generally lower power consumption.

SUMMARY

According to an embodiment of the present invention, a method for operating a memory system includes receiving thermal data indicating a temperature at addresses in a memory array, and a write request associate with data. An address of the write request is decoded. It is determined whether a temperature at the address of the write request is above a threshold temperature. The data is sent to a short latency write queue responsive to determining that the temperature is not above the threshold temperature.

According to another embodiment of the present invention, a system includes a memory and a processor controlling the memory. The processor is operative to receive thermal data indicating a temperature at addresses in a memory array, receive a write request associate with data, decode an address of the write request, determine whether a temperature at the address of the write request is above a threshold temperature, and send the data to a short latency write queue responsive to determining that the temperature is not above the threshold temperature.

According to yet another embodiment of the present invention, a computer program product comprising a computer readable storage medium having program instructions embodied therewith, the program instructions executable by a processor to cause the processor to perform a method includes receiving thermal data indicating a temperature at addresses in a memory array, receiving a write request associate with data, decoding an address of the write request, determining whether a temperature at the address of the write request is above a threshold temperature, and sending the data to a short latency write queue responsive to determining that the temperature is not above the threshold temperature.

DETAILED DESCRIPTION

The use of STT-MRAM or alternative DRAM devices offers improved performance and reduced power consumption in a smaller package. However, write tasks in STT-MRAM generally use a write current with a relatively long pulse width. The long pulse width tends to generate undesirable heat. Overheating STT-MRAM memory arrays can reduce the performance and service life of the memory arrays.

As the STT-MRAM continues to develop, three dimensional memory arrays have been designed that offer advantages over two dimensional memory arrays. In particular, three dimensional memory arrays consume less space on a wafer. One disadvantage of three dimensional memory arrays is that the three dimensional memory arrays tend to dissipate heat at a slower rate than two dimensional memory arrays.

The methods and systems described herein provide for managing the reading and writing of data to a memory array by determining the temperature of portions of the array and delaying reading and/or writing data to the portions of the array that are above a temperature threshold. Alternate exemplary methods and systems herein provide for adjusting the pulse width of data read and/or write operations to the memory array after determining the temperature of portions of the array.

In this regard, the methods and systems described herein provide for a long latency write queue and a short latency write queue that when in operation improve the thermal stability and reliability of the memory system.

Figure 1:
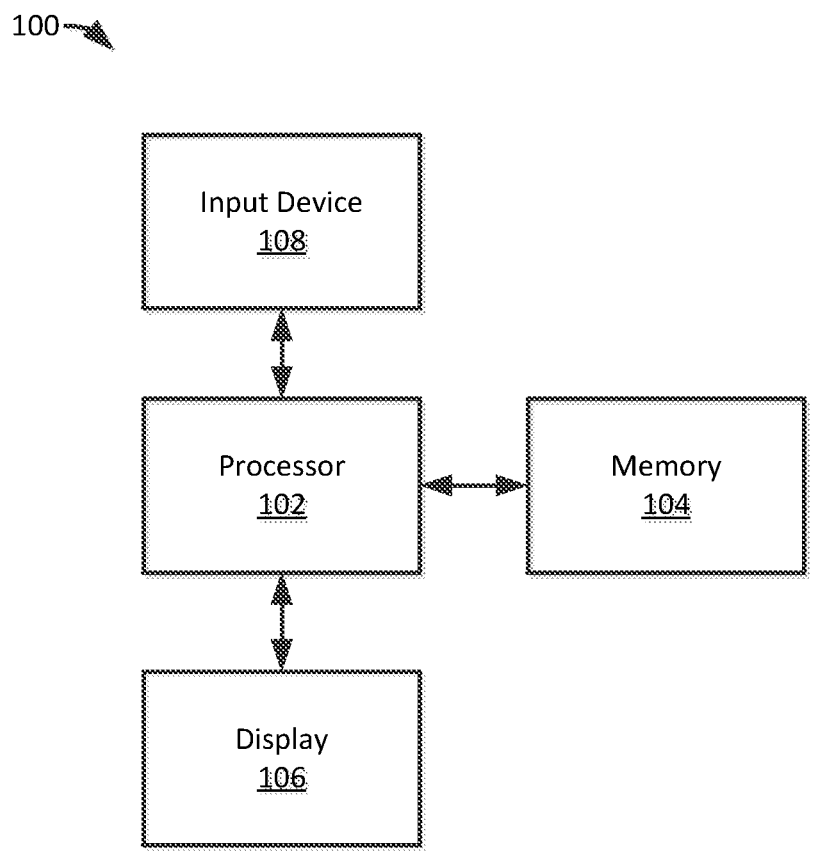
FIG. 1 illustrates a block diagram of an exemplary embodiment of a processing system.

FIG. 1 illustrates a block diagram of an exemplary embodiment of a processing system 100. The system includes a processor 102 that is communicatively connected to a memory 104, a display 106, and an input device 108.

Figure 2:
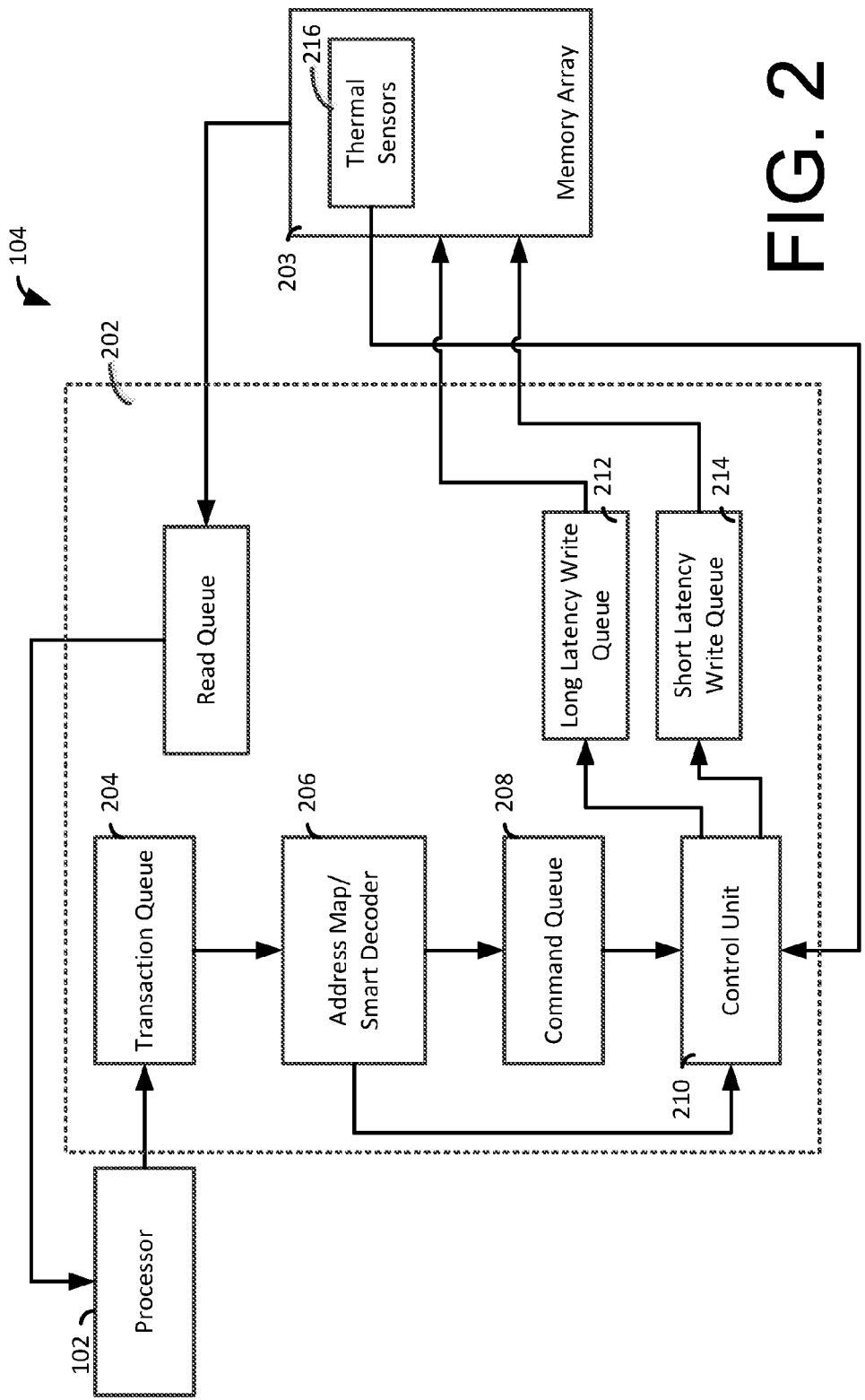
FIG. 2 illustrates a block diagram of an exemplary embodiment of the memory.

FIG. 2 illustrates a block diagram of an exemplary embodiment of the memory 104. The memory 104 includes a memory controller 202. The memory controller 202 is a processor or portion of a central processing unit or integrated circuit that performs logic to conduct memory functions. The memory controller 202 includes a transaction queue 204 that receives read/write requests from the processor 102. The transaction queue 204 sends read/write requests to the address map/smart decoder 206. The address map 206 decodes addresses in the memory array 203 of the read/write requests and determines which read/write requests and associated addresses are sent to the command queue 208. The address map 206 receives write data corresponding to different memory array 203 ranks. The command queue 208 sends the read/write requests to the control unit 210.

The control unit 210 receives addresses from the address map 206 and read/write addresses from the command queue 208. The control unit also receives thermal data from the thermal sensors 216 that are located in the memory array 203. The thermal data indicates the temperatures of areas, cells, DIMMs, levels, or any other portion or region of the memory array 202 that correspond to memory addresses.

The control unit 210 uses logic to determine whether an address of a particular read/write request is physically located in a location in the memory array that is above a temperature threshold using the temperature data received from the thermal sensors 216.

For a particular read/write request, the control unit 210 determines whether the temperature of the physical memory location corresponding to the address is higher than the threshold temperature. The control unit 210 receives rank information associated with the address of the read/write request. If the temperature at the rank associated with the address of the write request is higher than the threshold temperature, the control unit 210 sends the read/write request from the command queue 208 to the long latency write queue 212. If the temperature at the rank associated with the address of the write request is less than the threshold temperature, the control unit 210 sends the read/write request from the command queue 208 to the short latency write queue 214.

The control unit 210 is operative to schedule and sequence commands with appropriate timings when the write queues 212 and 214 are full. The control unit 210 may control the pulse widths used to write data to the memory array 203 according to the rank of the memory location that will be written to. The pulse width used for the read/write operations may correspond to particular ranks in the memory array 203 such that particular ranks in the memory array may be written to or read from using a particular pulse width (e.g., short or long) regardless of the thermal data from a particular rank or memory location in some exemplary embodiments.

Requests in the short latency write queue 214 may be processed in turn, while the requests in the long latency write queue 212 are processed at a slower rate than the short latency write queue 214. The slower rate of processing of the read/write requests in the long latency write queue 212 effectively reduces the net increase of the temperature in the physical memory locations that are higher than the threshold temperature. The long latency write queue 214 and the short latency write queue 212 operate as buffers, and the latency of the queues may be adjusted and controlled actively/dynamically by the system, or may be set to respective latency settings.

Figure 3:
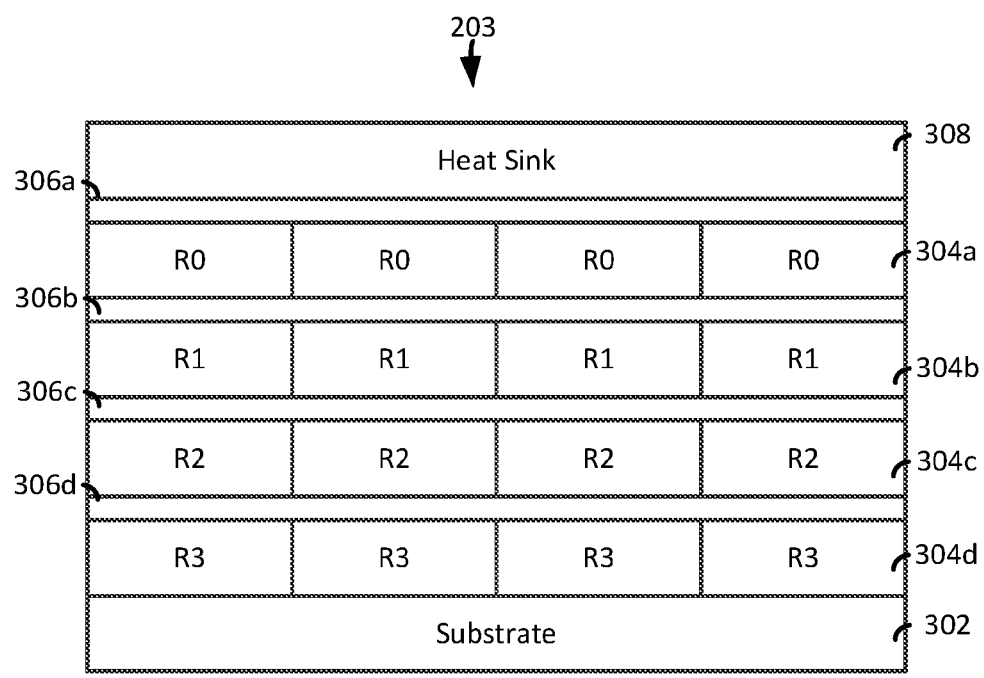
FIG. 3 illustrates a block diagram of an exemplary embodiment of the memory array.

FIG. 3 illustrates a block diagram of an exemplary embodiment of the memory array 203. In this regard, the memory array 203 is arranged on a substrate 302. In the illustrated exemplary embodiment, the memory array 203 is a three dimensional array having stacked dual in-line memory modules (DIMMs) 304a-304d. Thermal sensors 306a-306d are arranged on the DIMMs 304. A heat sink 308 is arranged on the memory array 203.

Though the illustrated exemplary embodiment shows DIMMS 304, the memory array 203 may include any type of memory array that is arranged in any type of arrangement including two dimensional or three dimensional arrays. Any number of thermal sensors may be distributed or arranged in the memory array 203 to sense the temperature of different regions of the memory array 203.

In the illustrated exemplary embodiments, the term physical memory location includes any particular location in the memory array that stores data. The physical memory location may include one or more memory locations that may be represented by or correspond to memory addresses.

Figure 4:
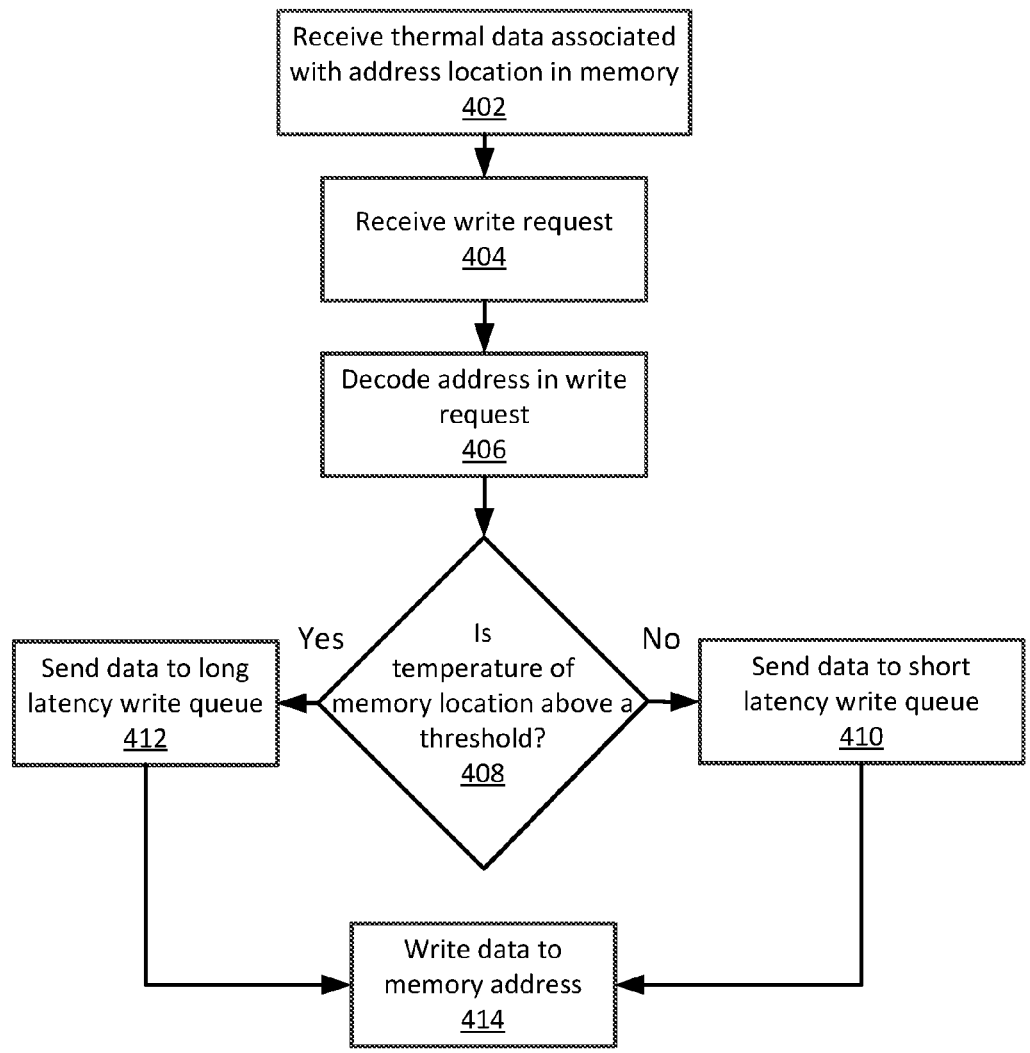
FIG. 4 illustrates a block diagram of an exemplary method of operation of the system.

FIG. 4 illustrates a block diagram of an exemplary method of operation of the system 100 (of FIG. 1). In block 402, the memory 104 receives thermal data from the thermal sensors 216 (of FIG. 2) of the memory array 104. The thermal data indicates temperatures of different physical locations or regions in the memory array 104. In block 404, a write request is received by the memory 104. In block 406, the address of the request is decoded. In block 408 the control unit 210 determines whether a temperature at a physical memory location that corresponds to the decoded address is above a temperature threshold. If no, the data is sent to the short latency write queue 214 in block 410. The data is sent from the short latency write queue 214 to the memory in block 414. The short latency write queue operates as a buffer that may be controlled using any desired memory scheme. Since the memory locations of the data sent to the short latency write queue 214 are below the temperature threshold, the writing of data to the addresses stored in the short latency write queue 214 need not be delayed due to temperature, and the write requests in the short latency write queue 214 may be processed at a faster rate than the write requests in the long latency write queue 212. The data in the short latency write queue 214 is written with a shorter pulse width (a pulse width shorter relative to a long pulse width described below). The write requests in the short latency write queue 214 may take priority over the write requests in the long latency write queue 212. Such a hierarchy allows the hotter memory addresses (or hotter memory array ranks) to further cool while write requests in the short latency write queue 214 are processed.

If the temperature of the memory location is above the threshold in block 408 (yes), the data is sent to the long latency write queue 212, from which write requests are processed at a lower rate relative to the processing of write requests stored in the short latency write queue 214. The data is sent from the long latency write queue 212 to the memory in block 414. The data in the long latency write queue 212 is written with a longer pulse width (a pulse width longer relative to the short pulse width used to write data in the short latency queue 214).

Figure 5:
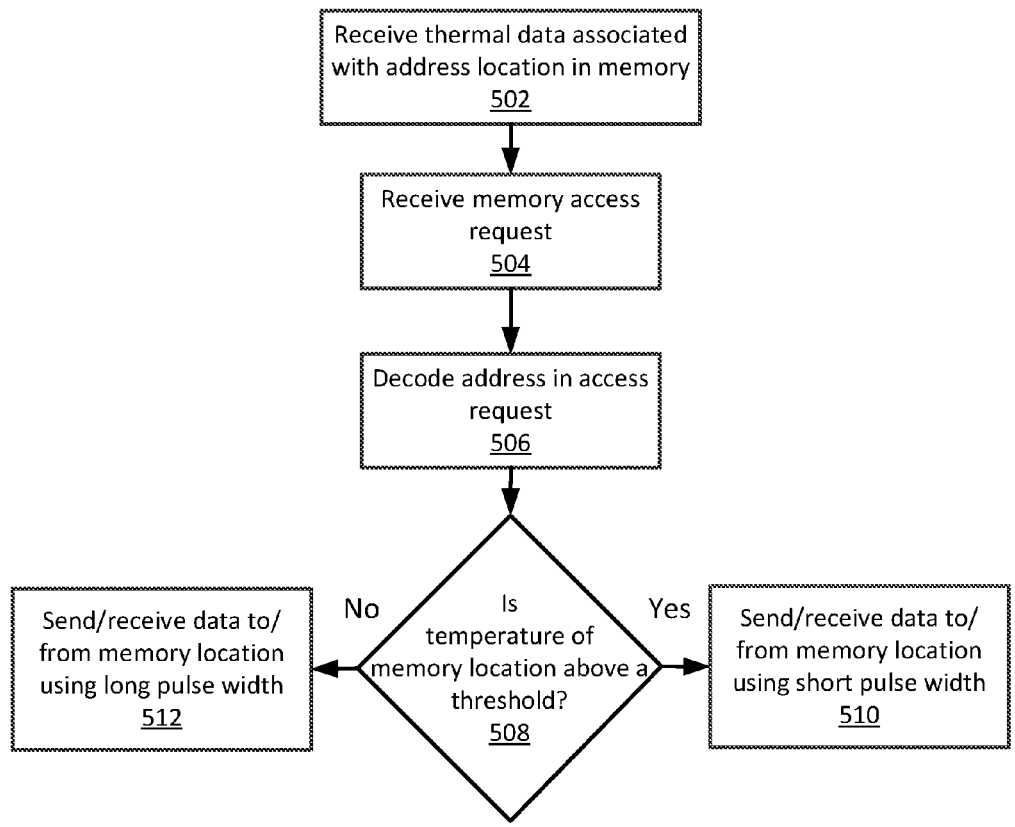
FIG. 5 illustrates a block diagram of another alternate exemplary method of operation of the system.

FIG. 5 illustrates a block diagram of another alternate exemplary method of operation of the system 100 (of FIG. 1). In this regard, in block 502, the memory 104 receives thermal data from the thermal sensors 216 of the memory array 104. The thermal data indicates temperatures of different physical locations or regions in the memory array 104. In block 504, a memory access request (read/write request) is received by the memory 104. In block 506 the address of the request is decoded. In block 508 the control unit 210 determines whether a temperature at a physical memory location that corresponds to the decoded address is above a temperature threshold. If no, the data is written or read from or to the memory in block 512 using a long pulse width. If yes, the memory access request data is written or read from or to the memory in block 510 using a short pulse width. Since a long pulse width of current increased the temperature of the memory location, the used of a short pulse width of current for read/write operations in higher temperature memory locations effectively lowers or reduces the temperature or net temperature increase in the device.

Figure 6:
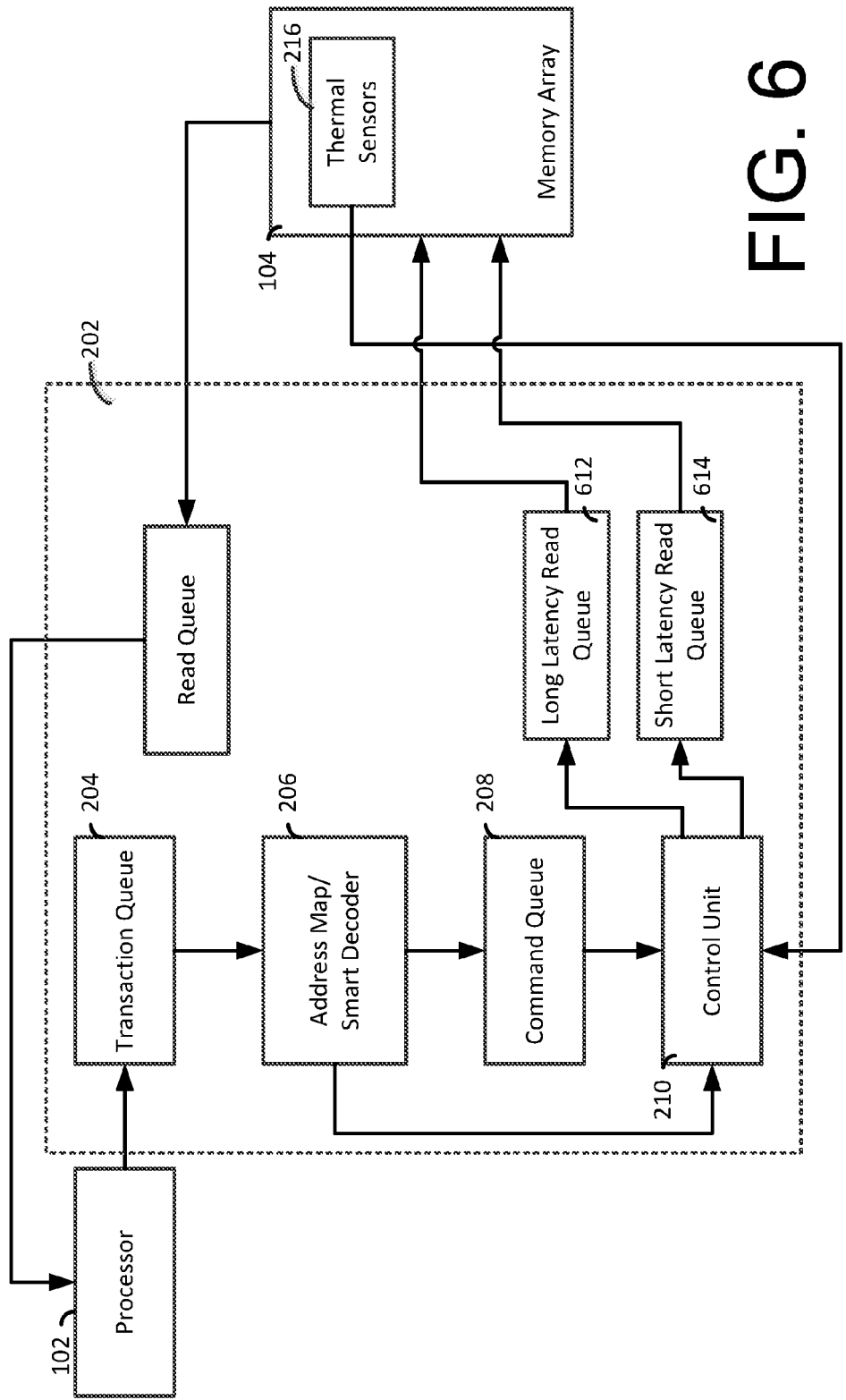
FIG. 6 illustrates a block diagram of an alternate exemplary embodiment of the memory.

FIG. 6 illustrates a block diagram of an alternate exemplary embodiment of the memory 104. The illustrated alternate exemplary embodiment is similar to the embodiment described above in FIG. 2, and portions and functions described with respect to FIG. 6 may be included in some embodiments in the embodiment described in FIG. 2. In this regard, the illustrated exemplary embodiment of FIG. 6 includes a long latency read queue 612 and a short latency read queue 614. The system 100 may perform read functions as described below, based on thermal data in a similar fashion as described above regarding write functions. The long latency read queue 614 and the short latency read queue 612 operate as buffers, and the latency of the queues may be adjusted and controlled actively/dynamically by the system, or may be set to respective latency settings.

Figure 7:
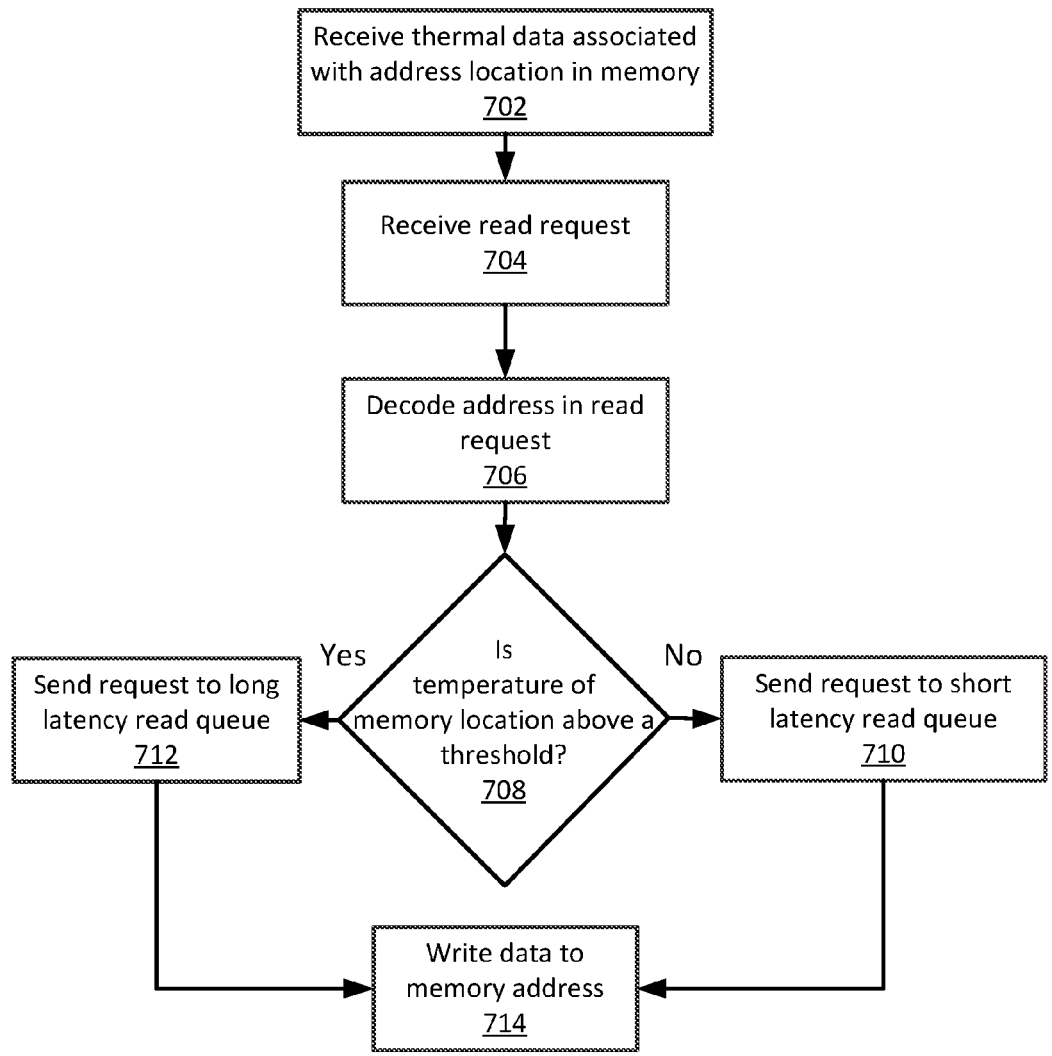
FIG. 7 illustrates a block diagram of an exemplary method of operation of the system.

FIG. 7 illustrates a block diagram of an exemplary method of operation of the system 100 (of FIG. 1). In this regard, in block 702, the memory 104 receives thermal data from the thermal sensors 216 of the memory array 104. The thermal data indicates temperatures of different physical locations or regions in the memory array 104. In block 704, a read request is received by the memory 104. In block 706 the address of the request is decoded. In block 708 the control unit 210 determines whether a temperature at a physical memory location that corresponds to the decoded address is above a temperature threshold. If no, the request is sent to the short latency read queue 614 (of FIG. 6) in block 710. The data request is sent from the short latency read queue 614 to the memory 104 in block 714. The short latency read queue 614 operates as a buffer that may be controlled using any desired memory scheme. Since the memory locations of the request sent to the short latency read queue 614 are below the temperature threshold, the reading of data from the addresses stored in the short latency read queue 614 need not be delayed due to temperature, and the read requests in the short latency read queue 614 may be processed at a faster rate than the read requests in the long latency write queue 612.

If the temperature of the memory location is above the threshold in block 708 (yes), the data is sent to the long latency read queue 614, from which read requests are processed at a lower rate relative to the processing of read requests stored in the short latency read queue 614. The data is sent from the long latency read queue 612 to the memory 104 (of FIG. 2) in block 714.

The embodiments described herein provide for a memory system that includes thermal sensors that are operative to detect the temperature of physical locations in the memory array. The control unit determines whether the locations in the array are above a particular temperature threshold prior to performing a read or write function in the memory location. The use of thermal sensors in the memory array improves the performance and reliability of the memory array.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for operating a memory system, the method comprising:
   receiving thermal data indicating a temperature at addresses in a memory array;
   receiving a write request associated with a data;
   decoding an address of the write request;
   determining whether a temperature at the address of the write request is above a threshold temperature;
   sending the data to a short latency write queue responsive to determining that the temperature is not above the threshold temperature; and
   sending the data to a long latency write queue responsive to determining that the temperature is above the threshold temperature.

2. The method of claim 1, wherein data from the short latency write queue is written to the address of the write request with a pulse having a first pulse width and the data from the long latency write queue is written to the address of the write request with a pulse with a second pulse width, the second pulse width is shorter than the first pulse width.

3. The method of claim 2, wherein the data is moved from the short latency write queue at a faster rate than the data is moved from the long latency write queue.

4. The method of claim 2, further comprising sending the data from the long latency write queue to the address of the write request.

5. The method of claim 2, wherein the data from the long latency write queue is written to the address of the write request using a short pulse width, and the data from the short latency write queue is written to the address of the write request using a long pulse width.

6. The method of claim 1, further comprising sending the data from the short latency write queue to the address of the write request.

7. The method of claim 1, further comprising sending data to the address in the memory system using a short pulse width responsive to determining that the temperature is above the threshold temperature and sending data to the address in the memory system using a long pulse width responsive to determining that the temperature is not above the threshold temperature.

8. A system comprising:
   a memory; and
   a processor controlling the memory, the processor operative to:
      receive thermal data indicating a temperature at addresses in a memory array;
      receive a write request associated with a data;
      decode an address of the write request;
      determine whether a temperature at the address of the write request is above a threshold temperature;
      send the data to a short latency write queue responsive to determining that the temperature is not above the threshold temperature; and
      send the data to a long latency write queue responsive to determining that the temperature is above the threshold temperature.

9. The system of claim 8, wherein data from the short latency write queue is written to the address of the write request with a pulse having a first pulse width and the data from the long latency write queue is written to the address of the write request with a pulse with a second pulse width, the second pulse width is shorter than the first pulse width.

10. The system of claim 9, wherein the data is moved from the short latency write queue at a faster rate than the data is moved from the long latency write queue.

11. The system of claim 9, wherein the processor is further operative to send the data from the long latency write queue to the address of the write request.

12. The system of claim 9, wherein the data from the long latency write queue is written to the address of the write request using a short pulse width, and the data from the short latency write queue is written to the address of the write request using a long pulse width.

13. The system of claim 8, wherein the processor is further operative to send the data from the short latency write queue to the address of the write request.

14. The system of claim 8, wherein the processor is further operative to send data to the address in the memory system using a short pulse width responsive to determining that the temperature is above the threshold temperature and send data to the address in the memory system using a long pulse width responsive to determining that the temperature is not above the threshold temperature.

15. A computer program product comprising a computer readable storage medium having program instructions embodied therewith, the program instructions executable by a processor to cause the processor to perform a method comprising:
   receiving thermal data indicating a temperature at addresses in a memory array;
   receiving a write request associated with a data;
   decoding an address of the write request;

determining whether a temperature at the address of the write request is above a threshold temperature; and sending the data to a short latency write queue responsive to determining that the temperature is not above the threshold temperature; and sending the data to a long latency write queue responsive to determining that the temperature is above the threshold temperature.

16. The computer program product of claim 15, wherein data from the short latency write queue is written to the address of the write request with a pulse having a first pulse width and the data from the long latency write queue is written to the address of the write request with a pulse with a second pulse width, the second pulse width is shorter than the first pulse width.

17. The computer program product of claim 16, wherein the data is moved from the short latency write queue at a faster rate than the data is moved from the long latency write queue.

18. The computer program product of claim 16, wherein the method further comprises sending the data from the long latency write queue to the address of the write request.

19. The computer program product of claim 16, wherein the data from the long latency write queue is written to the address of the write request using a short pulse width, and the data from the short latency write queue is written to the address of the write request using a long pulse width.

20. The computer program product of claim 15, wherein the method further comprises sending the data from the short latency write queue to the address of the write request.

* * * * *